United States Patent [19]

Ohashi

[11] Patent Number: 4,649,410

[45] Date of Patent: * Mar. 10, 1987

[54] RADIATION CONTROLLABLE THYRISTOR WITH MULTIPLE NON-CONCENTRIC AMPLIFIED STAGES

[75] Inventor: Hiromichi Ohashi, Yokohama, Japan

[73] Assignee: Tokyo Shibaura Denki Kabushiki Kaisha, Kawasaki, Japan

[*] Notice: The portion of the term of this patent subsequent to Jun. 17, 2003 has been disclaimed.

[21] Appl. No.: 744,655

[22] Filed: Jun. 14, 1985

Related U.S. Application Data

[63] Continuation of Ser. No. 391,920, Jun. 24, 1982, abandoned.

[30] Foreign Application Priority Data

Jun. 30, 1981 [JP] Japan .................. 56-101594

[51] Int. Cl.⁴ .......................................... H01L 27/14
[52] U.S. Cl. ...................................... 357/30; 357/20; 357/38; 357/86
[58] Field of Search ................. 357/30, 38, 86, 20

[56] References Cited

U.S. PATENT DOCUMENTS

| | | | |
|---|---|---|---|
| 3,622,845 | 11/1971 | McIntyre et al. | 357/38 |
| 3,858,236 | 12/1974 | Schafer et al. | 357/38 |
| 3,968,512 | 7/1976 | Voss | 357/38 |
| 4,142,201 | 2/1979 | Sittig et al. | 357/38 |
| 4,208,669 | 6/1980 | Silber et al. | 357/38 |
| 4,282,542 | 8/1981 | Silber et al. | 357/38 |
| 4,298,882 | 11/1981 | Homola et al. | 357/38 |

FOREIGN PATENT DOCUMENTS 2746406  4/1978  Fed. Rep. of Germany ........ 357/38 LA Primary Examiner—Joseph E. Clawson, Jr.
Attorney, Agent, or Firm—Oblon, Fisher, Spivak, McClelland & Maier

[57] ABSTRACT

A thyristor having a collecting electrode which is formed on a specific base layer adjacent to a specific emitter layer of the thyristor in order to absorb an excessive current generated in the specific base layer. A plurality of pilot thyristors are arranged inside the collecting electrode. Each gate electrode of the pilot thyristors is connected to an emitter electrode of the thyristor of the immediately preceding stage. An emitter electrode of the final stage of the thyristors is used commonly with the collecting electrode. A turn-on current from the collecting electrode serves as a gate current of the main thyristor.

4 Claims, 4 Drawing Figures

RADIATION CONTROLLABLE THYRISTOR WITH MULTIPLE NON-CONCENTRIC AMPLIFIED STAGES

This application is a continuation of application Ser. No. 391,920, filed June 24, 1982, now abandoned.

BACKGROUND OF THE INVENTION

The present invention relates to thyristors, and more particularly to an improved thyristor structure which greatly improves photosensitivity, yet still prevents the critical rate of rise of off-state voltage dv/dt from being exceeded.

P- and n-type layers are alternately formed in a four-layered semiconductor crystal structure. Generally, the four layers consist of a p-type emitter layer, an n-type base layer, a p-type base layer and an n-type emitter layer. An anode electrode is deposited on the p-type emitter layer which is the lowermost layer. A cathode electrode is deposited on the n-type emitter layer which is the uppermost layer. A gate electrode is deposited on the upper surface part of the p-type base layer adjacent to the cathode electrode. In the thyristor having the above configuration, when a trigger signal is applied to the gate electrode of the p-type base layer, a small area near the gate electrode is rendered conductive. This area expands to the entire area of the junction of the thyristor over time. When the critical rate of rise of on-state current di/dt is great during triggering, the current is concentrated only at a limited conductive area in the vicinity of the gate electrode, resulting in thermal breakdown due to a local temperature increase.

Along with the trend towards thyristors of higher dielectric strength and larger capacitance, a higher critical rate of rise of on-state current di/dt is desired without adversely affecting the thyristor's operation, while still maintaining the value of the gate control current be as small as possible. However, if a higher critical rate of rise of on-state current di/dt is used, the gate control current must generally be increased. A conventional thyristor cannot satisfy the contradictory requirements described above.

If a photothyristor which is triggered by light instead of by the gate current is used, the light energy to be used is limited and a gate drive with a higher current is difficult. Therefore, the critical rate of rise of on-state current di/dt cannot be increased.

It is strongly desired that a thyristor of high dielectric strength and large capacitance be developed which achieves an improved gate sensitivity without impairing the ability of the thyristor to operate accurately with respect to the critical rate of rise of on-state current di/dt.

Referring to FIG. 1, a prior art thyristor comprises a p-type emitter layer 10, an n-type base layer 12, a p-type base layer 14 and an n-type emitter layer 16 which is formed in an annular shape when viewed from the top outside the p-type base layer 14. An anode electrode 18 is deposited on one surface of the p-type emitter layer 10. A cathode electrode 20 is deposited on the upper surface of the n-type emitter layer 16. A plurality of pilot thyristors comprise the p-type base layer 14, the n-type base layer 12, the p-type emitter layer 10, and n-type emitter layers $22_1$, $22_2$ and $22_3$ concentrically disposed at equal intervals. A light-receiving portion 24 is formed at the center of the pilot thyristors.

If an optical trigger signal $\phi$ is radiated on the light-receiving portion of the thyristor with the above arrangement, a photocurrent Iph flows in the p-type base layer 14 transversely. This current flows into the cathode electrode 20 through a short-circuiting portion 26 disposed in the n-type emitter layer 16. A transverse potential difference established in the p-type base layer 14 due to the photocurrent Iph forward-biases the n-type emitter layers $22_1$, $22_2$ and $22_3$ of the pilot thyristors. When the voltage of the light-receiving portion 24 almost reaches the built-in potential of the junction formed between the p-type base layer 14 and the n-type emitter layer $22_1$, electron emission from the n-type emitter layer $22_1$ to the p-type base layer 14 is increased abruptly. As a result, the pilot thyristor near the light-receiving portion 24 is rendered conductive first. This turn-on (conduction) current flows into the second pilot thyristor through an electrode $28_1$. The turn-on current, as the higher gate drive current, causes the second pilot thyristor to turn on and conduct. Similarly, the turn-on current of the pilot thyristor then flows to the third pilot thyristor through an electrode $28_2$. As a result, the third pilot thyristor is rendered conductive. Further, the turn-on current of the third pilot thyristor flows into the main thyristor through the electrode $28_3$ to turn it on.

The current concentration which occurred in the initial turn-on period is dispersed by the plurality of pilot thyristors, preventing the occurence of hot spots and improving the critical rate of rise of the on-state current di/dt.

However, in the thyristor having the multi-layered amplification gate structure, the following drawbacks are presented. First, if the transverse potential difference of the p-type base layer 14 of the first pilot thyristor is increased, photosensitivity (gate sensitivity) is increased, but the gate tends to be erroneously turned on by voltage noise from the main thyristor. More particularly, if surge voltage noise is applied between the anode electrode 18 and the cathode electrode 20, a displacement current flows in the same route as the photocurrent Iph. As a result, the thyristor tend to be erroneously turned on. In other words, the critical rate of rise of off-state voltage dv/dt is the maximum rate of rise allowed which will not cause the thyristor to turn on, taking into account any voltage noise present and will hereinafter be referred to as the critical rate of rise of off-state voltage dv/dt.

More particularly, a radius R of the n-type emitter layer $22_1$ of the first pilot thyristor is decreased to limit the displacement current which may be generated in the n-type emitter layer $22_1$. Thus, the photosensitivity of the thyristor is improved without reducing the the critical rate of rise of off-state voltage dv/dt.

Secondly, if the number of pilot thyristors is increased, the later stage pilot thyristors and the main thyristor tend to be erroneously turned on due to voltage noise. This second drawback is more important than the first drawback. Since the displacement current flows over the entire junction area unlike the photocurrent Iph, the displacement current is increased toward the short-circuiting portion 26 of the n-type emitter layer 16 of the main thyristor.

Thirdly, if the number of pilot thyristors is increased, the minimum anode voltage for turning on the pilot thyristors, that is, the finger voltage is generally increased. When thyristors having large finger voltages are operated in parallel to each other, the ON voltage of the first thyristor which first turns on determines the respective anode voltages applied to the following thyristors. As a result, the remaining thyristors which have higher finger voltages than those of the conducted thyristors are not turned on.

The above drawbacks are also found in electrically triggered thyristors in addition to the photothyristors.

SUMMARY OF THE INVENTION

It is, therefore, an object of the present invention to provide a thyristor having an improved gate sensitivity (photosensitivity) while still preventing the critical rate of rise of off-state voltage dv/dt from being reduced.

It is another object of the present invention to provide a thyristor which allows free arrangement of pilot thyristors, while still allowing the thyristor to operate properly by preventing the critical rate of rise of off-state voltage dv/dt from being exceeded.

It is still another object of the present invention to provide a thyristor having an alignment between the light-receiving portion and the optical triggering system.

It is yet another object of the present invention to provide a thyristor having decreased finger voltage.

It is yet still another object of the present invention to provide a thyristor having improved turn-on characteristics.

It is a further object of the present invention to provide a thyristor having an improved critical rate of rise of on-state current di/dt.

These and other objects may be attained by the thyristor of the present invention which comprises: a four-layered main thyristor consisting of a first emitter layer, a first base layer, a second base layer and a second emitter layer which have alternate conductivity types and are alternately formed; a collecting electrode deposited on a surface part of the second base layer adjacent to the second emitter layer of the main thyristor to absorb unnecessary displacement current generated in the second base layer; and a plurality of pilot thyristors disposed in the collecting electrode, the plurality of pilot thyristors having, in the second base layer, a plurality of third emitter layers which have the same conductivity type as the second emitter layer and which are formed separately from the second emitter layer so that the plurality of pilot thyristors commonly use the first emitter layer, the first base layer and the second base layer with the main thyristor, the plurality of pilot thyristors each having a gate electrode formed on the second base layer surrounded by the third emitter layer, the gate electrodes being connected to emitter electrodes on the third emitter layers of the pilot thyristors of previous stages, and the emitter electrode of the pilot thyristor of the final stage being commonly used with the collecting electrode, whereby the turn-on current of the pilot thyristor of the final stage of the plurality of pilot thyristors is supplied as a gate current from the collecting electrode to said main thyristor.

According to the present invention, since the collecting electrode is arranged to absorb the displacement current, the displacement current influences the thyristor of the present invention much less than in the conventional thyristor. Therefore, the gate sensitivity is greatly improved without impairing the ability of thyristor to operate below the critical rate of rise of off-state voltage dv/dt. The displacement current is controlled, regardless of the number and arrangement of the stages of the pilot thyristors surrounded by the collecting electrode. Therefore, the thyristor according to the present invention can be readily designed to control the ability of the thyristor to operate below the critical rate of rise of off-state voltage dv/dt. If the present invention is applied to a photothyristor, the radius of the light-receiving portion can be increased, and alignment between the light-receiving portion and the optical triggering system is improved. Further, since the width of the second base layer of the pilot thyristor can differ from those of other layers, the maximum turn-on current of the first pilot thyristor is greatly decreased, resulting in a decreased number of pilot thyristors and a reduction of the finger voltage. With the above arrangement, the turn-on characteristics are also improved. Further, since the thyristor according to the present invention has a structure having the collecting electrode and the plurality of pilot thyristors, the critical rate of rise of on-state current di/dt is greatly improved.

BRIEF DESCRIPTION OF THE DRAWINGS

By way of example and to make the description clearer, reference is made to the accompanying drawings in which.

DETAILED DESCRIPTION OF THE PREFERRED EMBODIMENT

A thyristor according to a an embodiment of the present invention will be described with reference to the accompanying drawings.

Figure 1:
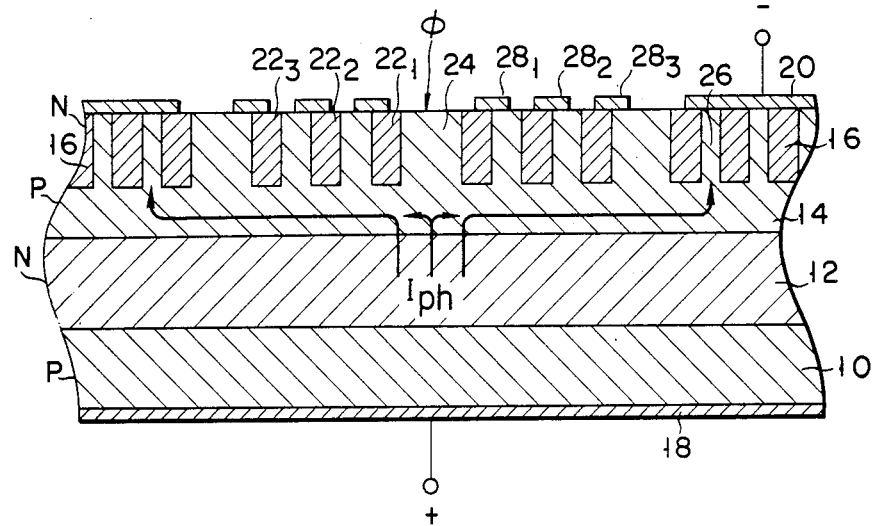
FIG. 1 is a schematic sectional view of a conventional photothyristor.
Figure 3:
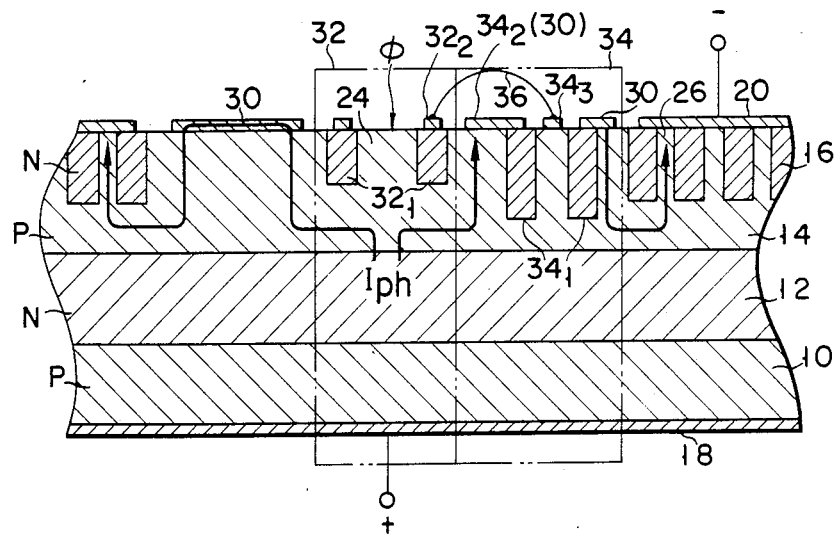
FIG. 3 is a schematic sectional view of the thyristor shown in FIG. 2.
Figure 2:
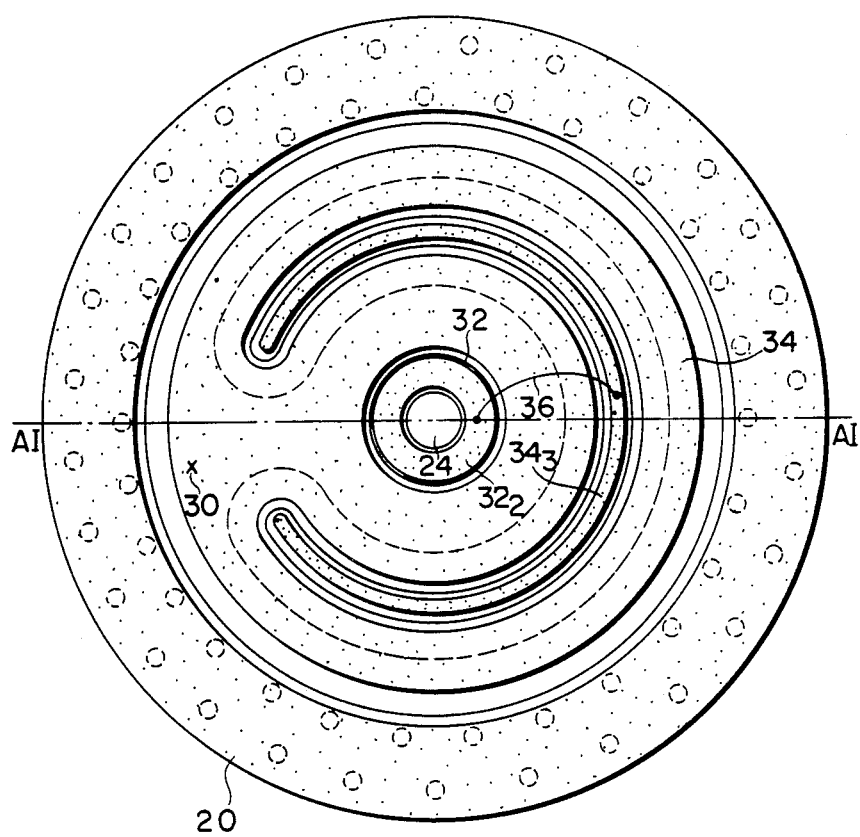
FIG. 2 is a schematic plan view showing the electrode arrangement of a thyristor according to an embodiment of the present invention.

FIG. 2 is a schematic plan view showing an electrode arrangement of the thyristor according to the embodiment of the present invention. FIG. 3 is a schematic sectional view of the thyristor taken along the line AI—AI in FIG. 2. The same reference numerals as in FIG. 1 denote the same parts in FIGS. 2 and 3.

A collecting electrode 30 is deposited on a p-type base layer 14 among the four semiconductor layers which constitute the thyristor. First and second pilot thyristors 32 and 34 are surrounded by the collecting electrode 30. An n-type emitter layer $32_1$, concentric with the light-receiving portion 24, is formed in the first pilot thyristor 32. A cathode electrode $32_2$ is deposited on the n-type emitter layer $32_1$. As shown in FIG. 2, the second pilot thyristor 34 is formed so as to surround the first pilot thyristor 32 in a horse shoe shape. The second pilot thyristor 34 comprises double n-type emitter layers $34_1$ surrounded by the collecting electrode 30, an emitter electrode $34_2$ formed on the n-type emitter layer $34_1$ and a gate electrode $34_3$ formed on the p-type base layer 14. The emitter electrode $34_2$ and the collecting electrode 30 are used commonly. The gate electrode $34_3$ of the second pilot thyristor 34 is electrically connected to the cathode electrode $32_2$ of the first pilot thyristor 32 through a conductor 36 such as an aluminum wire.

Therefore, the turn-on current of the first pilot thyristor 32 is supplied as the gate current of the second pilot thyristor 34. The depth of the n-type emitter layer $34_1$ of the second pilot thyristor 34 is deeper than that of the n-type emitter layer $32_1$ of the first pilot thyristor 32 so that the width of the p-type layer 14 of the second pilot thyristor 34 is smaller than that of the p-type base layer 14 of the first pilot thyristor 32.

If an optical trigger signal $\phi$ is radiated on the light-receiving portion 24 of the thyristor with the above arrangement, the photocurrent Iph is generated in a central depletion layer. The photocurrent Iph then flows into the p-type base layer 14. The flow-in current is collected in the collecting electrode 30 formed on the p-type base layer 14 as indicated by the arrow in FIG. 3. Thereafter, the photocurrent Iph flows into the cathode electrode 20 through the p-type base layer 14 and the short-circuiting portion 26. At this time, since the photocurrent Iph flows transversely in the p-type base layer 14 immediately below the first pilot thyristor 32, the n-type emitter layer $32_1$ of the first pilot thyristor 32 is forward-biased by the transverse potential difference in the p-type base layer. When the deepest potential in the forward bias almost reaches the built-in potential of the junction between the n-type emitter layer $32_1$ and the p-type base layer 14, electron injection from the n-type emitter layer $32_1$ to the p-type base layer 14 increases to turn on the first pilot thyristor 32.

A turn-on current Ip1 of the first pilot thyristor 32 is supplied as the higher gate drive current to the gate electrode $34_3$ of the second pilot thyristor 34 through the conductor 36 to turn on the second pilot thyristor 34. A turn-on current ip2 of the second pilot thyristor 34 flows through the collecting electrode 30 and the short-circuiting portion 26 and is supplied to the cathode electrode 20. This turn-on current ip2 serves as the gate current of the main thyristor to turn on the main thyristor.

With the above arrangement, the width of the p-type base layer 14 of the second pilot thyristor 34 is narrower than that of the p-type base layer 14 of the first pilot thyristor 32. The p-type base width directly influences the turn-on duration of the thyristor. If the width of the p-type base layer is narrower, the turn-on duration is generally short. When the second pilot thyristor 34 is turned on by the turn-on current ip1 of the first pilot thyristor 32, the turn-on current of the second pilot thyristor is abruptly increased. As a result, only a small amount of current is required to be output from the first pilot thyristor 32. Since the width of the base layer of the second pilot thyristor 34 is small, sharp turn-on operation is performed. Therefore, the turn-on characteristics of the group of pilot thyristors are improved greatly as compared with the conventional thyristor arrangement in which all the base layers have the same width.

Figure 4:
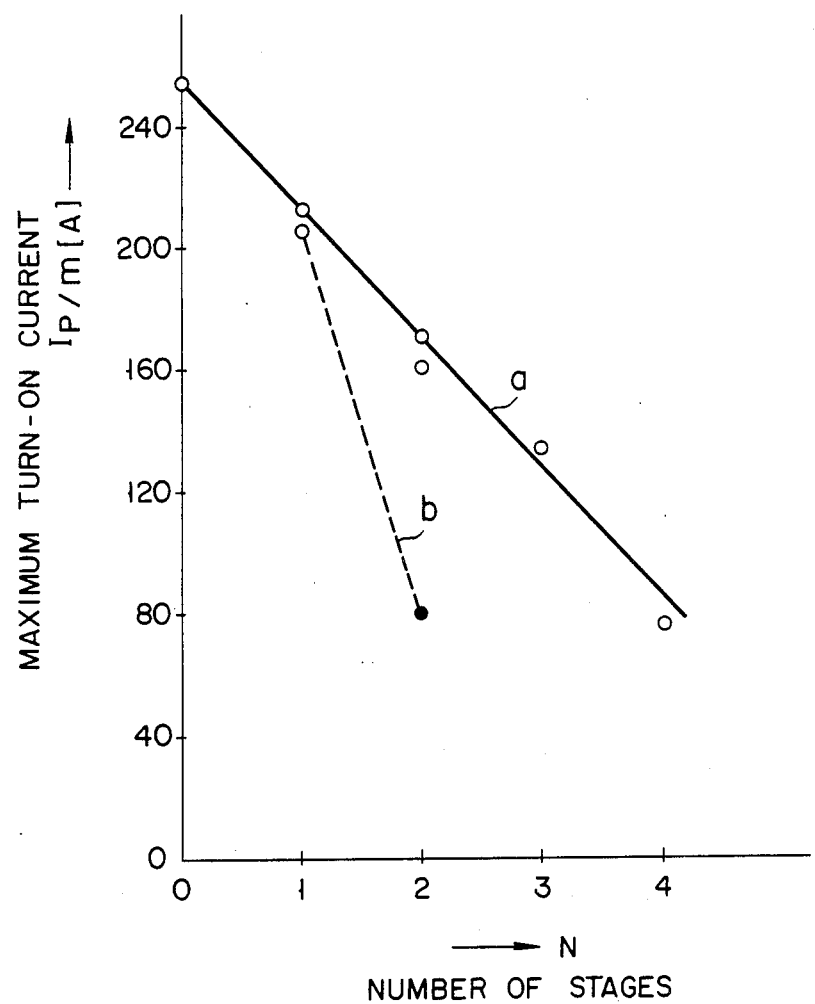
FIG. 4 is a graph for explaining the maximum turn-on current of a first pilot thyristor of the thyristor shown in FIG. 2 as a function of the number of stages thereof as compared with the maximum turn-on current of the conventional thyristor as a function of the number of stages thereof.

FIG. 4 is a graph for explaining the number N of stages of pilot thyristors as a function of maximum turn-on current Ip1m of the first pilot thyristor, where N=0 indicates a conventional thyristor without having pilot thyristors. Line a indicates the electrical characteristics of the conventional thyristor shown in FIG. 1, while line b indicates the electrical characteristics of the thyristor according to the present invention.

As is apparent from the graph, along with an increase in the number N of stages of thyristors, the maximum turn-on current of the first stage is linearly decreased, so far as the conventional structure in which all widths of the p-type base layers of the pilot thyristors are the same is concerned. However, according to the arrangement of the thyristor of the present invention, the maximum turn-on current Ip1m can be reduced into half or less with the two stage structure. Assume that the maximum turn-on current Ip1m is to be as 80 A. Then, a four-stage arrangement must be utilized in the conventional thyristor arrangement.

According to the present invention, the first pilot thyristor 32 produces only a small current without requiring an increase in the number of stages of pilot thyristors. Since the radius R of the first pilot thyristor 32 is decreased and the displacement current is effectively controlled, the ability of the thyristor to operate below the critical rate of rise of off-state voltage dv/dt is not impaired and the gate sensitivity (photosensitivity) is greatly improved. Further, according to the present invention, since the number N of stages of the pilot thyristors can be decreased, the finger voltage can also be decreased.

The second pilot thyristor 34 does not completely encompass the first pilot thyristor 32, so that the displacement current developed in the first pilot thyristor 32 need not be considered in designing the second pilot thyristor 34. Therefore, the pilot thyristors can be arranged freely and the operating characteristics of the thyristor with respect to the critical rate of rise of off-state voltage dv/dt can be readily controlled. Since the width and length of the n-type emitter layer $34_1$ of the second pilot thyristor 34 are determined to be sufficiently large, the initial turn-on region can be sufficiently large. Although a relatively large current is required to be generated from the second pilot thyristor 34, the turn on characteristics of the device with regard to the critical rate of rise of on-state current di/dt are not lowered.

The present invention is not limited to the particular embodiment. For example, in the embodiment, the present invention is applied to the photothyristor. However, the present invention may be applied to an electrically triggered thyristor which has a gate electrode in the light-receiving portion 24. Further, pilot thyristors need only be arranged to be surrounded by the collecting electrode formed in the base layer so as to sequentially electrically connect the pilot thyristors. Therefore, the number of stages is not limited to two as shown in the embodiment and may be arbitrarily changed as needed in accordance with design specifications.

Various changes and modifications may be made within the spirit and scope of the present invention.

What is claimed is:

1. A thyristor comprising:
   a main thyristor having at least a first emitter layer, a first base layer, a second base layer and a second emitter layer, said layers being alternately layered in the order mentioned and said first emitter layer and said second base layer being one conductivity type and said first base layer and said second emitter layer being the other conductivity type;
   an anode electrode provided on said first emitter layer;
   a cathode layer provided on said second emitter layer;
   a collecting electrode formed on a surface of said second base layer and having a surrounding portion defining a closed area in said surface of said second base layer;

a plurality of serially connected pilot thyristors each formed in said closed area and commonly using said first emitter layer, said first base layer and said second base layer, each of said pilot thristors comprising, a third emitter layer in the shape of a closed loop and having the same conductivity type as said second emitter layer, a gate electrode formed on said second base layer of said one conductivity type surrounded by said closed loop of said third emitter layer, and a cathode electrode formed on said third emitter layer of said other conductivity type;

wherein the closed loop third emitter layers of the plurality of pilot tyristors are independently formed such that no closed loop third emitter layer of any pilot thyristor is located within, or completely surrounded by, the closed loop third emitter layer of another pilot thyristor;

wherein a cathode electrode of a preceding stage pilot thyristor is connected to a gate electrode of a succeeding pilot thyristor through an externally provided conductor, and a third emitter layer of a final stage pilot thyristor is coupled to the second base layer of said main thyristor through said collecting electrode.

2. A thyristor according to claim 1, wherein the width of said second base layer of said pilot thyristor of a first stage of said plurality of pilot thyristors is greater than the width of said second base layer of at least one of other pilot thyristors.

3. A thyristor according to claim 1, wherein said pilot thyristor of the first stage of said plurality of pilot thyristors is turned on in response to an optical trigger signal.

4. A thyristor according to claim 1, wherein said collecting electrode has a circular shape and comprises said pilot thyristor of a first stage at the center of said collecting electrode and at least an other pilot thyristors having a horse shoe shape and partially surrounding said first pilot thyristor.

* * * * *